(12) United States Patent
Mutharasan et al.

(10) Patent No.: US 10,139,270 B2
(45) Date of Patent: Nov. 27, 2018

(54) ASYMMETRIC SENSOR

(75) Inventors: Rajakkannu Mutharasan, West Chester, PA (US); Blake N. Johnson, Philadelphia, PA (US); Ramji S. Lakshmanan, Dublin (IE); Harsh Sharma, Jersey City, NJ (US)

(73) Assignee: Drexel University, Philadelphia, PA (US)

( * ) Notice: Subject to any disclaimer, the term of this patent is extended or adjusted under 35 U.S.C. 154(b) by 352 days.

(21) Appl. No.: 13/808,138

(22) PCT Filed: Jul. 7, 2011

(86) PCT No.: PCT/US2011/043244
§ 371 (c)(1),
(2), (4) Date: Mar. 15, 2013

(87) PCT Pub. No.: WO2012/006460
PCT Pub. Date: Jan. 12, 2012

(65) Prior Publication Data
US 2013/0205902 A1 Aug. 15, 2013

Related U.S. Application Data

(60) Provisional application No. 61/362,233, filed on Jul. 7, 2010.

(51) Int. Cl.
*G01H 11/08* (2006.01)
*H01L 41/113* (2006.01)

(52) U.S. Cl.
CPC .......... *G01H 11/08* (2013.01); *H01L 41/1132* (2013.01); *H01L 41/1136* (2013.01)

(58) Field of Classification Search
CPC . G01H 11/08; H01L 41/1132; H01L 41/1136; H01L 41/1134
(Continued)

(56) References Cited

U.S. PATENT DOCUMENTS

| | | | |
|---|---|---|---|
| 2005/0193823 A1* | 9/2005 | Amano | 73/704 |
| 2007/0169553 A1 | 7/2007 | Mutharasan et al. | |

(Continued)

OTHER PUBLICATIONS

International Patent Application No. PCT/US2011/043244: International Search Report and Written Opinion dated Nov. 8, 2011, 8 pages.

(Continued)

*Primary Examiner* — Manish S Shah
*Assistant Examiner* — Rose M Miller
(74) *Attorney, Agent, or Firm* — Baker & Hostetler LLP

(57) ABSTRACT

An asymmetric sensor having asymmetric electrodes and/or being asymmetrically anchored provides enhanced sensitivity. In example embodiments, part of the electrode on a sensor is etched or removed resulting in enhanced mass-change sensitive resonant modes. In another example embodiment, a sensor is anchored asymmetrically, also resulting in enhanced mass-change sensitive resonant modes. By asymmetrically anchoring a piezoelectric portion of a sensor, resonant bending modes of the sensor can be measured electrically without external instrumentation. Modifying the electrode of a piezoelectric cantilever enables expression of mass-change sensitive resonant modes that normally do not lend themselves to electrical measurement.

8 Claims, 12 Drawing Sheets

(58) Field of Classification Search
USPC .................................................. 73/579, 662
See application file for complete search history.

(56) References Cited

U.S. PATENT DOCUMENTS

| | | | |
|---|---|---|---|
| 2008/0087083 A1 | 4/2008 | Nishizawa et al. | |
| 2009/0007645 A1 | 1/2009 | Shih et al. | |
| 2009/0053709 A1 | 2/2009 | Mutharasan et al. | |
| 2009/0301196 A1* | 12/2009 | Wang | G01N 29/022 73/579 |
| 2010/0297687 A1* | 11/2010 | Mutharasan | G01N 27/12 435/29 |

OTHER PUBLICATIONS

Sharma, et al., Piezoelectric Cantilever Sensors With Asymmetric Anchor Exhibit Picogram Sensitivity in Liquids, Sensors and Actuators, 2011, pp. 64-70.

* cited by examiner

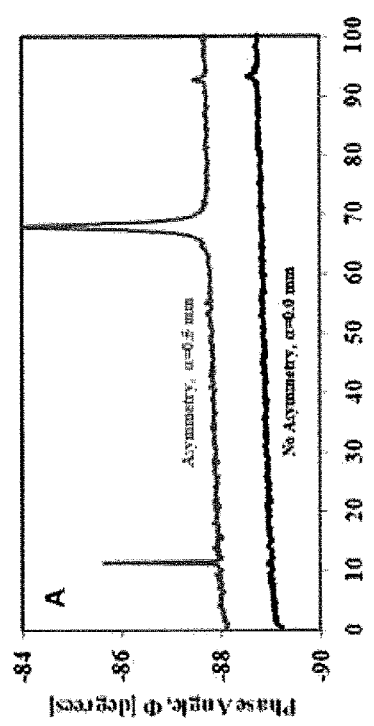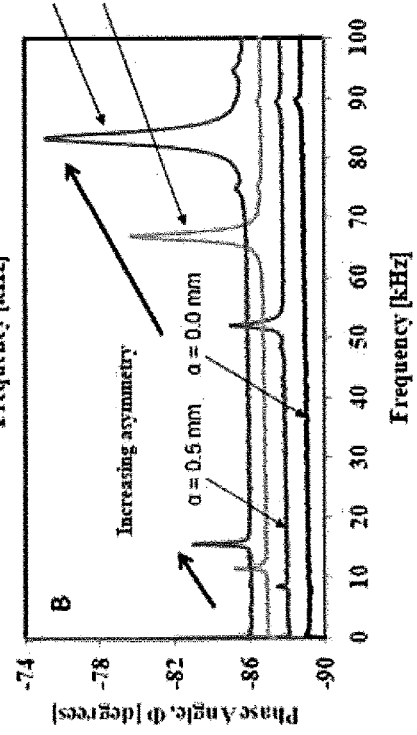
FIGURE 2A
FIGURE 2B

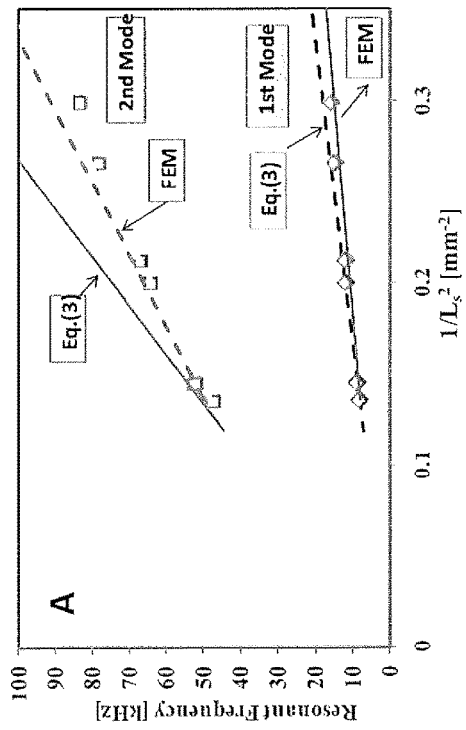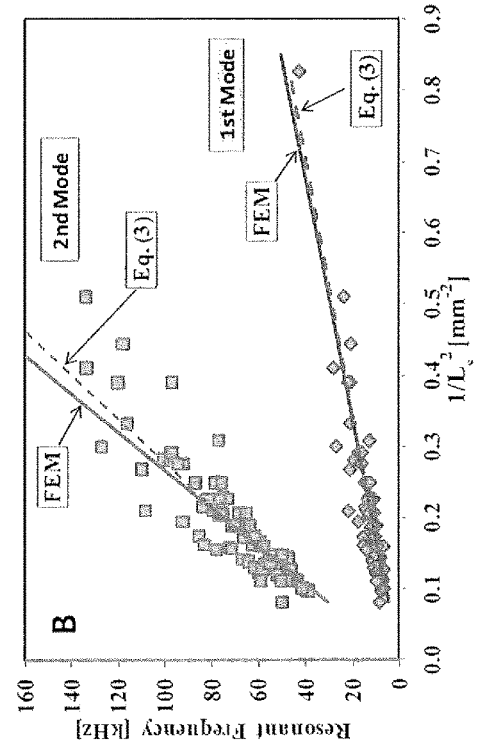
FIGURE 4A
FIGURE 4B

ASYMMETRIC SENSOR

CROSS-REFERENCE TO RELATED APPLICATIONS

This application is the National Stage of International Application No. PCT/US2011/043244, filed Jul. 7, 2011, which claims the benefit of U.S. Provisional Application No. 61/362,233, filed Jul. 7, 2010, the disclosures of which are incorporated herein by reference in their entireties.

GOVERNMENT RIGHTS

This invention was made with government support under grant number CBET-0828987 awarded by the National Science Foundation. The government has certain rights in the invention.

TECHNICAL FIELD

The technical field generally relates to sensors, and more specifically relates to piezoelectric cantilever sensors having asymmetric anchors and/or electrodes.

BACKGROUND

Cantilever sensors have enjoyed considerable interest among researchers because of their high sensitivity and their potential for high throughput applications with label-free reagents. Resonant-mode cantilever sensors respond to attached analytes by reduction in resonant frequency. The change in resonant frequency is proportional to analyte concentration, and can be measured by a variety of methods, which can include integrated transducing elements within the oscillating cantilever and external instrumentation that measures the cantilever oscillation amplitude. In both cases, the actuation of the cantilever can be provided by natural thermal fluctuations or by actuating the base of the cantilever electromechanically.

There have been several attempted innovative methods for measuring resonance, both internal and external to the sensor. However, more sensitive sensors continue to be sought.

SUMMARY

An asymmetric sensor having asymmetric electrodes and/or being asymmetrically anchored is described herein. In example embodiments, part of the electrode on a sensor is etched or removed, or a sensor is anchored asymmetrically, resulting in enhanced mass-change sensitive resonant modes. In an example embodiment, by asymmetrically anchoring a piezoelectric portion (such as a lead zirconate titanate, PZT, portion for example) of a sensor, resonant bending modes of the sensor can be measured electrically without external instrumentation that measures sensor oscillation. This approach is an improvement over bonding a non-piezoelectric material to induce measurable bending modes as it improves mass-change sensitivity due to avoidance of parasitic mass of non-piezoelectric layer. In another example embodiment, modifying the electrode of a piezoelectric cantilever enables expression of mass-change sensitive resonant modes that normally do not lend themselves to electrical measurement.

BRIEF DESCRIPTION OF THE DRAWINGS

FIG. 2A illustrates an experimental frequency response spectra showing the measurability of bending modes due to anchor asymmetry of a sensor.

FIG. 2B illustrates measured changes in the resonant frequencies as a function of extent of anchor asymmetry of the sensors 16, 18, 20, and 22 shown in FIG. 1.

FIG. 4A and FIG. 4B illustrate dependence of resonant modes on the shorter length of asymmetrically anchored cantilevers.

FIG. 11 includes FIG. 11A and FIG. 11B.

DETAILED DESCRIPTION

Figure 1:
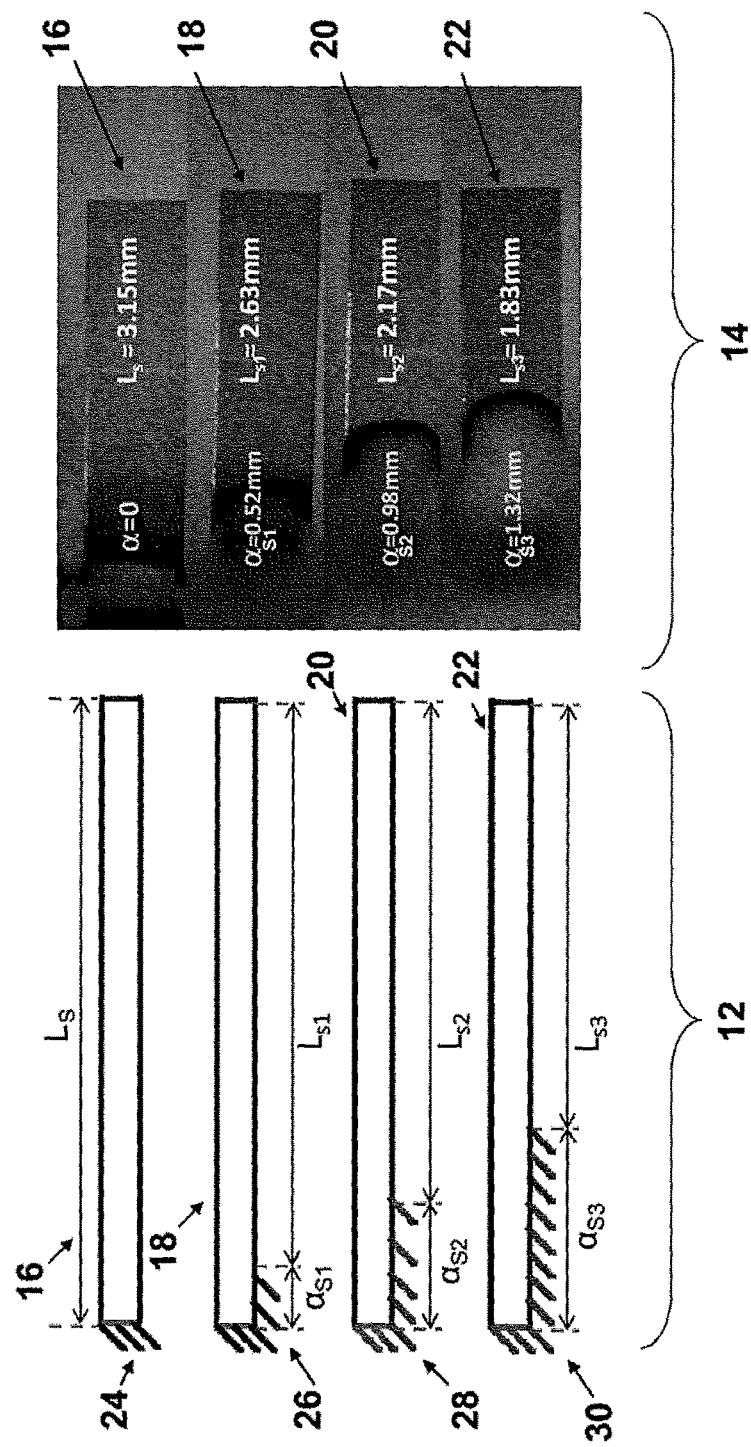
FIG. 1 illustrates cross sectional views and bottom views of symmetrically and asymmetrically anchored PZT cantilever sensors.

As described herein, part of the electrode on a sensor is etched or removed, or the sensor is anchored asymmetrically, which results in mass-change sensitive resonant modes that are expressed and enhanced by the device. This disclosure pertains to example methods of electroding lead zirconate titanate (PZT), for example, to induce electrically-observable resonant modes useful for biosensing, or the like Also, as described herein a sensor may comprise an asymmetric anchor.

Experiments were conducted to measure performance of asymmetric sensors. The experiments, results, and fabrication of the sensors are described herein.

Asymmetric Anchors

In example embodiments, piezoelectric cantilever sensors consisting only of lead zirconate titanate (PZT) are selfexciting and self-sensing of resonance if they are asymmetrically anchored. Symmetrically-anchoring has not been observed to give rise to electrically measurable resonant modes. As described herein, sensitivities of first and second bending mode resonances are characterized in a flow apparatus using small density changes in liquid and by chemisorptions of dodecanethiol at 60 pM. Density change experiments yielded mass-change sensitivity of ~33 ng/Hz and 217 pg/Hz for the first two modes. In chemisorptions experiments, where binding was restricted to a 1 mm tip of the PZT cantilever sensor, sensitivity improved by an order of magnitude to 3.9 pg/Hz and 828 fg/Hz for the same two resonant modes.

In the conducted experiments, the PZT layer was excited at $10^3$ v/m and the resulting current was measured. The phase angle ($\Phi$) between the excitation voltage and the resulting electric current in the piezoelectric layer exhibited sharp change in $\Phi$ at resonance due to altered electrical impedance of PZT, caused by higher than normal strain at resonance. The glass layer served to constrain longitudinal deformation of PZT, thus inducing bending mode vibration of the integrated cantilever. Such an integrated sensor has yielded successful label-free biosensing in liquid at 50 picograms using low-order (<60 kHz) resonant modes. Described herein are PZT cantilever sensors that are devoid of the parasitic non-piezoelectric glass layer, and a novel approach for anchoring PZT that enables induction of measurable bending mode resonance is described. A PZT cantilever anchored uniformly or symmetrically and excited electrically exhibits longitudinal deformation, and weak transverse or bending vibration that are not transduced into electrical impedance change because the resulting symmetric mode shapes cause no net accumulation of charge in PZT. Since bending modes have been associated with detection sensitivity, methods and configurations that induce measurable impedance change at bending resonant modes of PZT cantilevers were investigated. By anchoring the PZT in epoxy asymmetrically, it was found that bending modes that are not normally measurable became electrically measurable. Because one side of the PZT cantilever is longer than the other, due to asymmetrical anchoring, differential longitudinal deformation occurs inducing transverse vibration that causes charge accumulation in PZT that the bending mode resonances become electrically measurable. As described herein, the low order bending modes are more sensitive than a PZT-glass and PZT-stainless steel cantilever sensors anchored symmetrically.

Materials utilized to conduct experiments included phosphate buffered saline solution (PBS, 10 mM, pH 7.4) purchased from Sigma-Aldrich (Alletown, Pa.) were prepared in deionized water (18 M$\Omega$, Milli-Q system, Millipore), and subsequently diluted to obtain 2.5 and 5.0 mM solutions. Ethanol (analytical grade) and dodecanethiol (99%) were purchased from Sigma.

FIG. 1 illustrates cross sectional views and bottom views of symmetrically and asymmetrically anchored PZT cantilever sensors. The left panel 12 illustrates cross sectional views of symmetrically and asymmetrically anchored PZT cantilever sensors. The right panel 14 shows respective samples of fabricated PZT cantilever sensors, viewed from the bottom (underside) of the sensor.

As shown in FIG. 1, sensor 16 is anchored at the cross hatched portion 24. Sensor 16 is symmetrically anchored. Sensor 16 is not anchored on the bottom or top of the sensor 16. Sensor 16 is anchored only at its left edge. The length of the unanchored portion of the sensor 16 is depicted as $L_S$ in left panel 12 of FIG. 1. As depicted in right panel 14 of FIG. 1, the length of the unanchored portion of the sensor 16 is 3.15 mm.

Sensor 18 is asymmetrically anchored. Sensor 18 is anchored at the cross hatched portion 26. Sensor 18 is anchored at the left edge and at the bottom portion of the sensor 18. The top portion of sensor 18 is not anchored, thus anchoring the bottom portion of sensor 18 and not the top portion of sensor 18 results in sensor 18 being asymmetrically anchored. The length of the anchored bottom portion of the sensor 18 is depicted as $\alpha_{S1}$ in left panel 12 of FIG. 1. As depicted in right panel 14 of FIG. 1, the length of the anchored bottom portion of the sensor 18 is 0.52 mm. The length of the unanchored bottom portion of the sensor 18 is depicted as $L_{S1}$ in left panel 12 of FIG. 1. As depicted in right panel 14 of FIG. 1, the length of the unanchored bottom portion of the sensor 18 is 2.63 mm.

Sensor 20 is asymmetrically anchored. Sensor 20 is anchored at the cross hatched portion 28. Sensor 20 is anchored at the left edge and at the bottom portion of the sensor 20. The top portion of sensor 20 is not anchored, thus anchoring the bottom portion of sensor 20 and not the top portion of sensor 20 results in sensor 20 being asymmetrically anchored. The length of the anchored bottom portion of the sensor 20 is depicted as $\alpha_{S2}$ in left panel 12 of FIG. 1. As depicted in right panel 14 of FIG. 1, the length of the anchored bottom portion of the sensor 20 is 0.98 mm. The length of the unanchored bottom portion of the sensor 20 is depicted as $L_{S2}$ in left panel 12 of FIG. 1. As depicted in right panel 14 of FIG. 1, the length of the unanchored bottom portion of the sensor 20 is 2.17 mm.

Sensor 22 is asymmetrically anchored. Sensor 22 is anchored at the cross hatched portion 30. Sensor 22 is anchored at the left edge and at the bottom portion of the sensor 22. The top portion of sensor 22 is not anchored, thus anchoring the bottom portion of sensor 22 and not the top portion of sensor 22 results in sensor 22 being asymmetrically anchored. The length of the anchored bottom portion of the sensor 22 is depicted as $\alpha_{S3}$ in left panel 12 of FIG. 1. As depicted in right panel 14 of FIG. 1, the length of the anchored bottom portion of the sensor 22 is 1.32 mm. The length of the unanchored bottom portion of the sensor 22 is depicted as $L_{S3}$ in left panel 12 of FIG. 1. As depicted in right panel 14 of FIG. 1, the length of the unanchored bottom portion of the sensor 22 is 1.83 mm. Although the various lengths depicted in FIG. 1 were used to conduct experiments as described herein, it is to be understood that any appropriate lengths may be utilized.

The piezoelectric sensors depicted in FIG. 1 were fabricated from 1×5×0.127 mm$^3$ PZT layer (Piezo Systems, Woburn, Mass.). The top and bottom surfaces of the PZT layer at the anchored end were connecting to excitation voltage source. The cantilever was anchored in a 6 mm glass tube by a non-conductive epoxy. Initial anchoring was obtained by ensuring that both sides of PZT were embedded to the same depth in epoxy. After the spectral properties were determined, additional epoxy was applied to one side of PZT and epoxy in the glass tube to introduce asymmetry in the anchor. The other side of the sensor remained at the original free length (L). After the applied epoxy had cured, its spectral property was measured. Several sensors (n>60) were prepared with asymmetric anchor for spectral property evaluation. The asymmetric dimension ($\alpha$) was varied from 10% to 65% of the free length. For in-liquid applications, the sensors were parylene C coated following the vendor supplied protocol for providing electrical insulation. Deposition of a gold layer on the sensors (used in chemisorption experiments) was carried out in a Denton DESK IV sputtering unit (Denton Vacuum LLC, Moorestown, N.J.).

The experimental setup comprised an impedance analyzer (HP 4192A or Agilent, HP4294A), a peristaltic pump, a custom flow cell and several fluid reservoirs. The flow cell has a hold-up volume of 120 µl, and was maintained in an incubator at 30±0.1° C. to ensure isothermal conditions. Prior to an experiment, the entire flow loop was rinsed with 100% ethanol followed by copious amount of DI water. The resonant frequency change during an experiment was monitored continuously by a custom-written LabView® program. The flow loop was operated in either a single pass mode or in a recirculation mode.

In a typical example experiment, a sensor was vertically installed in the flow cell and the flow rate was set at 0.6 mL/min. In the density change experiments the flow loop was filled with DI water and the resonant frequency was allowed to reach steady state. Subsequently, the flow was switched to PBS and the sensor was allowed to reach a new steady state. To confirm that the sensor response was due to density change experiments alternated between DI water and PBS of various concentrations. The chemisorption experiments were done with gold coating on the cantilever tip by sputtering 100 nm thick at the distal 1 mm² area. After stabilizing the sensor in the flow cell at 0.6 mL/min ethanol, the flow was switched to 30 pM dodecanethiol in ethanol and the change in resonant frequency of the first two resonant modes were monitored.

The PZT cantilever of thickness t, and of free lengths L and $L_s$ containing asymmetry $\alpha$ ($=L-L_s$) shown in FIG. 1 were simulated using a commercial finite element modeling (FEM) software, COMSOL 3.4 (COMSOL Group, Burlington, Mass.). The expected deformation in PZT at 100 mV excitation is small, and thus plane stress model was invoked for cantilever deformation mechanics. Zero deflection at the anchor (depicted in FIG. 1) was imposed. The properties of PZT-5A used for simulation and for fabrication of experimental sensors are given in supplemental materials as shown in Table S1 below.

TABLE S1

| Material | Density [kg/m^3] | Young's Modulus [Pa] | Poisson Ratio | Elasticity Matrix [Pa] | Coupling Matrix [C/m^2] | Relative Permittivity |
|---|---|---|---|---|---|---|
| PZT-5A | 7750 | — | — | c11 = 1.20 e11<br>c12 = 7.52 e10<br>c13 = 7.51 e10<br>c22 = 1.20 e11<br>c23 = 7.51 e10<br>c33 = 1.11 e11<br>c44 = 2.11 e10<br>c55 = 2.11 e10<br>c66 = 2.26 e10 | e31 = −5.35<br>e32 = −5.35<br>e33 = 15.78<br>e24 = 12.29<br>e15 = 12.29 | ε11 = 919.1<br>ε22 = 919.1<br>ε33 = 826.6 |

Constitutive equations that represent the coupling between the electric field and mechanical deformation of the PZT layer are given by:

$$T = c^E S - e^t E \quad (1)$$

$$D = eS + \varepsilon^S E \quad (2)$$

where T, S, E, and D denote stress, strain, electric fields, and electric displacement (or induction), respectively. The term $c^E$ is the elasticity tensor evaluated at a constant (zero, short and open circuit) electric field, e is the piezoelectric tensor, and $\varepsilon^s$ is the dielectric permittivity measured at constant (zero, clamped) strain.

The model included the coupling of electrical and mechanical effects in the PZT domain. Loss factor damping in PZT was adjusted manually until the results were close to the experimental quality factors. Loss factor used in this paper was 1% in all calculations. The total number of elements in each simulation ranged from 72 to 1152; convergence was observed with minimal mesh resolution due to the simple cantilever geometry. The number of elements used was increased such that the calculated resonance frequencies and phase angles converged within <0.01%. Initial charge in PZT, initial stress, and external force were set to zero. Using the principle of virtual work option, resonance frequencies of the finite element model were computed. An eigenvalue solver was used for determining resonance frequencies and eigenvalues. As a check, cantilevers of uniform cross-section and isotropic properties yielded eigenfrequency values within an accuracy of few part per million when compared with the analytical model (Equation (3)). Boundary current density obtained from the FEM calculation was integrated over the electrode area to obtain total current (I) as a function of excitation frequency. The response output variables, phase angle ($\Phi=\tan^{-1}$ [Im(I)/Re (I)]) and impedance (Z=V/I) were then calculated.

Effect of Asymmetric Anchor on Resonance Measurability

FIG. 2 illustrates two graphs, A and B, depicting phase angles versus frequency response. FIG. 2A illustrates an experimental frequency response spectra showing the measurability of bending modes due to anchor asymmetry of a sensor. FIG. 2B illustrates measured changes in the resonant frequencies as a function of extent of anchor asymmetry of the sensors 16, 18, 20, and 22 shown in FIG. 1. The plots depicted in FIG. 2B have a 1° offset for clarity.

In an example embodiment, the electrically measurable resonant modes of an excited PZT cantilever sensors manifest resonance by a sharp peak in phase angle ($\Phi$) between excitation voltage (V) and resulting current (I) in PZT at the corresponding excitation frequency. PZT cantilevers that are anchored symmetrically (e.g., sensor 16 depicted in FIG. 1) show phase angle values close to −90° for the entire frequency range of 0-100 kHz indicating that the device acts electrically as a pure capacitor; see FIG. 2A. Since PZT is a dielectric ceramic with piezoelectric properties, at resonance the charge accumulated in PZT is small or nearly zero such that one measures no deviation from capacitive behavior. In the example shown in FIG. 2A, the length of the sensor was 2.5 mm, and such a device has bending modes determined by FEM eigenfrequency analysis at 9.79 and 60.75, but the modes were not observable experimentally. When the PZT (L=3.2 mm) was asymmetrically epoxy-anchored with $\alpha$=0.3 mm, two bending modes were electrically measurable at 11.3 kHz ($\Phi$=−85.7°, Q=37) and at 67.8 kHz ($\Phi$=−83.9°, Q=44), as shown in FIG. 2A. The phase angle profile shown is plotted with an offset of one degree for clarity. All sensors fabricated (n>60), in the size range L=2 to 4 mm, and an asymmetry $\alpha$=0.2 to 1.5 mm exhibited at least two resonant modes in 0-100 kHz as measured by phase angle. Two questions emerge when one examines the results in FIG. 2. What is the effect of asymmetry, in relation to the length L on resonant frequency and its intensity as measured by Φ? Second, what geometric parameter determines the location of resonant frequency and its intensity? It is recognized that cantilever length is a significant parameter. Both of these questions are answered using experiments, finite element model and an approximate analytical model.

Effect of Asymmetric Anchor Extent (α) on Resonant Frequency and its Intensity

To determine the effects of the asymmetry parameter α, sensors were fabricated with symmetric anchor first and then progressively increased asymmetry extent by adding epoxy to one side of the base of the PZT cantilevers in a predetermined fashion. After the epoxy had cured, the frequency spectrum of the modified sensor was determined. This progressive approach allowed modification of a single sensor and evaluate changes in its spectral properties in a systematic fashion. In FIG. 2B it is shown the spectrum of one such sensor (sensor 18 of FIG. 1, wherein total length, L,=3.15 mm) and was typical of all fabricated sensors (n=16). Sensors with symmetric anchor (spectrum shown in black) showed no measurable resonant modes. When anchor asymmetry was introduced by reducing the length on one side from 3.15 mm to 2.63 mm (sensor 18 of FIG. 1), two low-order modes appeared with the first mode at 8.54 kHz (Φ=−88.5°; Q=16) and the second mode at 52.03 kHz (Φ=−86°; Q=52). Upon increasing the extent of asymmetry further by reducing the length from 2.63 to 2.17 mm (sensor 20 of FIG. 1) the two resonant modes increased both in location (11.53 and 66.5 kHz) and phase angle (Φ=−87.1°, −81.8°). It was found that the peak amplitudes depend on the extent of asymmetry introduced, a result confirmed by the finite element model. A conclusion drawn from examining the spectra of over 30 similarly constructed sensors is that asymmetry increases both resonant frequency and the phase angle.

Comparison of Finite Element Model and Experiments

Figure 3A:
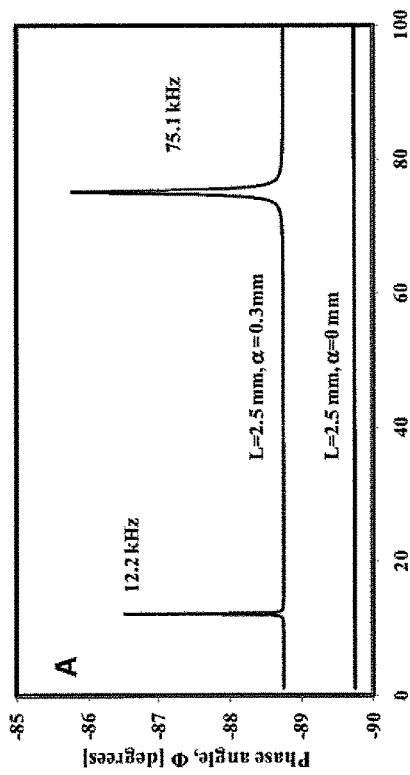
FIG. 3A illustrates a finite element model (FEM) solution showing effects of anchor asymmetry and phase angle behavior at resonance for the sensors depicted in FIG. 2A.
Figure 3B:
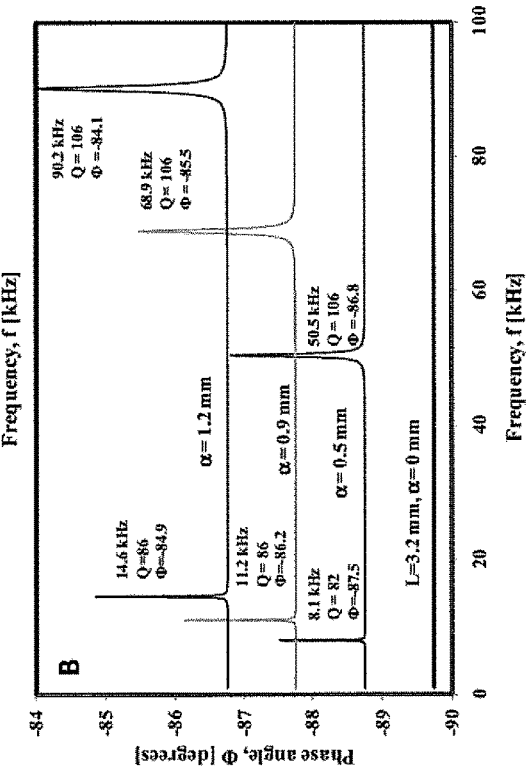
FIG. 3B illustrates a FEM solution for resonant modes as a function of anchor asymmetry extent.

FIG. 3 contains FIG. 3A and FIG. 3B. FIG. 3A illustrates a finite element model (FEM) solution showing effects of anchor asymmetry and phase angle behavior at resonance for the sensors depicted in FIG. 2A. FIG. 3B illustrates a FEM solution for resonant modes as a function of anchor asymmetry extent. The solutions correspond to the fabrication shown in panel 14 of FIG. 1 and the experimental spectra illustrated in FIG. 2B. Plots are shown in FIG. 3B with a 1° offset for clarity.

A two dimensional (2D) FEM of the PZT cantilever was constructed to determine the effects of anchor asymmetry on resonance frequency and the corresponding charge accumulation in PZT at resonance. Magnitude of current correlates with phase angle. Mathematically, symmetric anchor is one in which no constraint is specified along both top and bottom length of the cantilever. The distal end is also unconstrained. Zero displacement is specified at the left plane (shown as hatched boundary) in FIG. 1. Electrical boundary condition of excitation voltage is specified on the electrodes-top and bottom surfaces. Such a boundary condition excites the sensor at the same 100 mV potential used experimentally. Sensor 16 of FIG. 1 is an example of a symmetric anchor and sensors 18, 20, and 22 of FIG. 1 represent asymmetric anchors of various extents. The hatched boundaries (24, 26, 28, 30) in FIG. 1 are constrained (zero displacement), while the unhatched boundaries are unconstrained. Eigenfrequency analysis yields resonant frequency values and current in PZT. The eigenfrequency of a symmetrically anchored PZT cantilever ($L=L_s=3.2$ mm) yields resonance at 5.98, 37.25, and 103.29 kHz, but experimentally resonance was not observed from measurement of phase angle, Φ in the same frequency range (FIG. 3B). Frequency response analysis of the finite element model enables calculation of dynamic steady-state response as a function of the excitation frequency. This analysis solves for resonance electrically as was done experimentally. Although eigenfrequency calculations showed that the PZT cantilever has three bending resonant modes in 1-130 kHz, frequency response analysis indicated that the resonant modes were not measurable by impedance changes because the resonance behavior did not manifest electrically, and is illustrated in FIG. 3B. One notes that there was no change in phase angle or change in current in PZT at the resonance for a symmetric anchor. This result compares exactly with the experimental measurement that a perfectly symmetric anchor (α=0) leads to no electrical manifestation of resonance. To confirm the experimental observation that resonant modes become observable with anchor asymmetry, the FEM was modified with asymmetric anchor boundary condition was solved. The results (FIG. 3B) show that the resonant modes obtained from eigenfrequency analysis becomes observable by phase angle measurement only if asymmetry boundary is present. The asymmetry in the anchor results in a change in current at resonance resulting in phase angle change. Thus removal of symmetry allows charge accumulation in PZT instead of destructive neutralization.

In FIG. 3B the FEM frequency response spectra of cantilevers with various extents (L=3.2, σ=0.5,0.9,1.3 mm) of anchor asymmetries are shown. Asymmetry extent significantly affects both the resonant frequency values and Φ, but minimally affects the Q-values, and is consistent with experiments. For the case α=0, the mechanical resonance was not present electrically. Although mechanical resonant modes were predicted by eigenfrequency analysis, the phase angle and current density did not vary at resonant frequency, but remained nearly constant at 2.3 and 14.4 A/m2 for the two modes. For the case α=0.5 mm, the first and second modes were determined by FEM at 8.05 (Q=82°, Φ=−87.54° and 50.54 (Q=106, Φ=−86.76°) kHz, respectively. Further increase in asymmetry α to 0.9 or 1.2 mm led to further increases in resonant frequency and phase angle, and are consistent with experimental results. The FEM and experimental results for the various asymmetries investigated are summarized in Table S2 below.

TABLE S2

| | | Experimental | | | | | | Finite Element Mode (FEM) | | | | | | | |
| | | First Mode | | | Second Mode | | | First Mode | | | | Second Mode | | | |
| $L_s$ mm | α mm | f (kHz) | Phase Φ | Q-value | f (kHz) | Phase Φ | Q-value | f (kHz) | Phase Φ | Q-value | ΔI (A/m²) | f (kHz) | Phase Φ | Q-value | ΔI (A/m²) |
|---|---|---|---|---|---|---|---|---|---|---|---|---|---|---|---|
| 2.62 | 0.52 | 8.5 | −88.5° | 16 | 52.0 | −85.9° | 52 | 8.06 | −87.5° | 86 | 12.2 | 50.45 | −86.8° | 106 | 127 |
| 2.17 | 0.98 | 11.5 | −87.2° | 23 | 66.8 | −81.8° | 61 | 11.15 | −86.2° | 86 | 19.4 | 68.85 | −85.5° | 106 | 199 |
| 1.82 | 1.32 | 15.5 | −85.9° | 31 | 83.3 | −78.1° | 45 | 14.6 | −84.9° | 86 | 33.3 | 90.15 | −84.1° | 106 | 316 |

The FEM results correlate the increase in current density (I) at resonance to phase angle increases. For example, the current density change (ΔI) corresponding to the case α=0.5 mm was 12.2 and 127 A/m² for the first and second modes, respectively. For the case of α=0.9 mm the phase angle values were higher compared to the α=0.5 mm case, and FEM results show that the current density change was also higher for both modes, being ΔI=19.4 and 199.8 A/m², respectively. As observed experimentally the case α=1.2 mm led to the highest Φ and ΔI for both the modes (ΔI=33.3 and 316 A/m², respectively). Since the frequency of resonant modes was dependent on the asymmetry level, the role of α on resonant frequency values was further investigated.

Role of Asymmetry Extent on Frequency Response of PZT Cantilevers

The PZT cantilevers were fabricated such that one of the flat sensor surfaces was fixed in epoxy to a greater extent than the other, thus introducing asymmetric anchor. This resulted in the length of one side of the cantilever to be longer than the other. Since low-order bending modes are measurable in asymmetrically anchored PZT cantilevers, an understanding of their dependence on the introduced asymmetry will be of great value in design. Resonant frequency (fn) of an uniform cross section cantilever depends on the spring constant and effective mass, and hence on the cantilever length.

$$f_n = \frac{\lambda_n^2}{2\pi} \frac{1}{L^2} \sqrt{\frac{EI}{wt\rho_c}} = \frac{1}{2\pi}\sqrt{\frac{k}{m_{e,n}}} \quad (3)$$

where $\lambda_n$ are the nth root of: $1+\cos h(\lambda_n) \cos(\lambda_n)=0$. The parameters k and $m_{e,n}$ are the effective spring constant (=3EI/L3; E is Young's modulus of PZT, I is moment of inertia wt³/12) and the effective cantilever mass (=3mc/$\lambda_n^4$, mc is cantilever mass $\rho_c$wtL), respectively. Equation (3) suggests that the resonant frequency depends on inverse of cantilever length squared.

FIG. 4 includes FIG. 4A and FIG. 4B. FIG. 4 illustrates dependence of resonant modes on the shorter length ($L_s$) of asymmetrically anchored cantilevers. In FIG. 4A, the sensors of same initial length (L=3.15 mm) are anchored asymmetrically to various extent as shown in FIG. 1. In FIG. 4B the sensors of various initial lengths asymmetrically are anchored. Both first and the second mode resonant frequency strongly depend on $L_s$. Results are compared with FEM calculations and modeled in Eq. (3) with L=$L_s$. Since asymmetric anchor was created by modifying the cantilever length, and experimentally increasing the anchor asymmetry parameter α increased the resonant frequency, it is reasonable to expect the increase depends linearly with $1/L_s^2$.

Such a relationship holds true and is illustrated in FIG. 4A for the two sets of sensors fabricated with L=3.15 mm, and epoxy was added in steps as shown in FIG. 1. The resonant frequency values of the six sensors show a near perfect linear relationship for both modes. On the same plot FEM solution corresponding to the boundary condition illustrated in FIG. 1A is also shown. The agreement between experiment and FEM suggest that the resonant frequency of asymmetrically anchored sensor can be calculated with reasonable accuracy from Equation (3) by setting the length as Ls.

A plot similar to FIG. 4A was prepared which included all sensors tested (n>60). The longer length of fabricated PZT cantilevers were in the range of L=1.2 to 3.5 mm with asymmetries ranging from a=0.03L to 0.69L. When the short length ($L_s$) was greater than 1.5 mm both the first and the second modes were present in 0-100 kHz, and for sensors with $L_s$<1.5 mm only a single mode in the same frequency range was measured. As one can see in FIG. 4B, deviation from linear dependence for the second mode is seen for the sensors $1/L^2 s$>0.3 mm⁻², which represents sensors with large asymmetry values, α. This deviation is because long asymmetric anchor made of epoxy is likely to act as an "epoxy cantilever" attached to the PZT cantilever. In addition for large α values, the sensor geometry deviates significantly from that of a cantilever as length and width dimensions are nearly equal. The data in FIG. 4 show that small asymmetry (α<0.5 mm) is sufficient to express measurable resonant modes, and if fundamental resonant frequency is to be increased, extent of asymmetry should be increased. It is reasonable to ask if the short length controls the eigenfrequency, what advantage there is in having additional PZT that is anchored on only one side in epoxy. The answer is that a sensor with equal length on both sides, whether be it short or long, would constitute a symmetric anchor and the resonant mode will not be measurable. Although the resonant mode is present in a highly diminished state in a sensor with perfect anchor, its impedance change at resonance would be far too small for measurement. Consequently asymmetry in the anchor is paramount for measuring electrically resonance in PZT cantilevers.

Sensitivity of Asymmetrically-Anchored PZT Cantilever Sensors to Changes in Density of Surrounding Medium The resonant modes respond in a symmetrically-anchored PZT cantilevers respond to mass addition. For example, when a PZT cantilever is immersed in DI water, the resonant frequency decreases because of the significant increase in the density of the surrounding medium. While such results give mass sensitivity information, it is important to investigate the frequency shifts for small density changes in liquid, as that more closely represents sensing response to target analytes. It was noted here that the purpose is not to show that the PZT cantilevers are density sensors, but use of such an experimental approach to calculate mass-change sensitivity. The fluid adjacent to the sensor acts as added mass and one can estimate the mass-change sensitivity using density change experiments. A change from DI water to 2.5 mM PBS is a small change in density of 0.003 g/cm³, and hence the frequency response to such a density change can provide a measure of sensitivity.

Figure 5A:
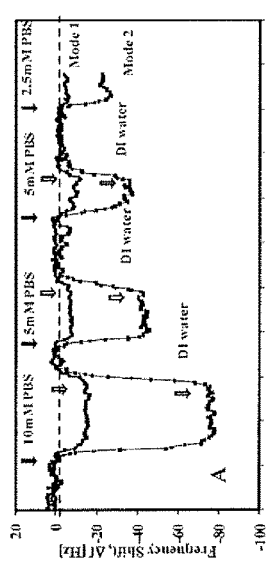
FIG. 5A illustrates frequency shift responses for alternate changes in liquid density from DI water to various concentrations of PBS.
Figure 5B:
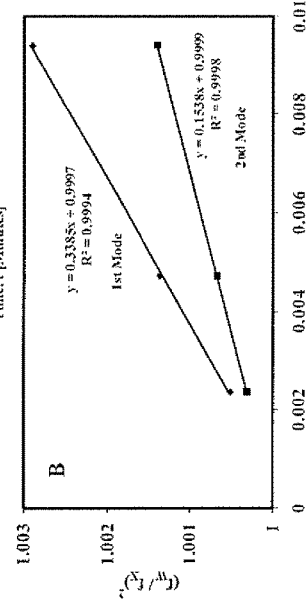
FIG. 5B illustrates frequency shifts obtained for various density liquids.
Figure 5C:
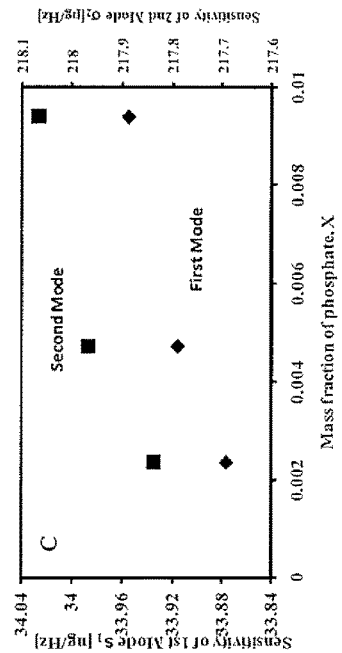
FIG. 5C illustrates sensitivity of the two modes as a function of added mass.

FIG. 5 includes FIG. 5A, FIG. 5B, and FIG. 5C. FIG. 5A illustrates frequency shift responses for alternate changes in liquid density from DI water to various concentrations of PBS. FIG. 5B illustrates frequency shifts obtained for various density liquids agree with the model given in Eq. (8) below. FIG. 5C illustrates sensitivity of the two modes as a function of added mass, and is plotted as a function of solute (phosphate) mass fraction. The density values corresponding to the three mass fractions are: 1.001, 1.004 and 1.008 g/cm³.

FIG. 5A shows frequency response to various density fluids. The sensor (L=3.1 mm, $f_1$=11.7; $f_2$=63.1 kHz) in a custom-built flow cell and allowed to reach a steady state (t<15 minutes) in DI water at 0.6 mL/min. DI water was then replaced by admitting 10 mM PBS and the resonant frequency response of the two modes were monitored continuously. The decrease in resonant frequency occurred in a few minutes, and reached a new steady state value. Re-introduction of DI water caused the resonant frequency to return to the original value. In a similar fashion, alternately switched between DI water and 5 mM and 2.5 mM PBS. Frequency shifts of 18, 8 and 2 Hz in f1 and 63, 32 and 14 for f2 were observed in response to a density change from DI to the three PBS solutions. The near linear dependence of average responses (n=8) to density is plotted in FIG. 5B. The results confirm that higher frequency modes exhibit a greater response for the same imposed density change.

Considering the density change as an added mass (Δm) response, Equation (3) can be written as:

$$f'_n = \frac{1}{2\pi}\sqrt{\frac{k}{\left[\frac{3}{\lambda_n^4}[(m)_c + \Delta m]\right]}} = \frac{1}{2\pi}\sqrt{\frac{k}{(m_{c,n} + \Delta m_n)}} \quad (4)$$

where the added fluid mass is assumed to be uniformly distributed along the entire cantilever length. Thus, the effective mass addition due to surrounding density change can be written as:

$$\Delta m_n = \frac{k}{4\pi^2}\left[\frac{1}{f'^2_n} - \frac{1}{f^2_n}\right] \quad (5)$$

In the above, all parameters are known and thus the effective mass change due to density change can be calculated, and the sensor mass-change sensitivity (a=ratio of mass change/resonant frequency change) can be computed from:

$$\sigma = \frac{\Delta m_n}{(f_n - f'_n)} = \frac{k}{4\pi^2}\left[\frac{f_n + f'_n}{f^2_n f'^2_n}\right] \quad (6)$$

For the case of shift from DI water to 2.5 mM PBS, the first mode and second mode responses were 3 and 10 Hz, and effective mass change for the two modes were 101.6 and 6.9 ng, yielding σ values of 33.9 pg/Hz and 217.8 pg/Hz. A plot of σ values of the two modes is plotted as a function of added equivalent mass computed using Equation (5) is shown in FIG. 5B. The increasing trend with increasing mass fraction of solute indicates that numerically σ increases with added equivalent mass (Δm$_n$). That is, mass-change sensitivity decreases. The results in FIG. 5B show that for the same density change of DI water to 2.5 mM PBS, the calculated sensitivities of the first and second mode are: σ~33.9 ng/Hz and 217 pg/Hz, respectively.

An alternate method of analyzing density change is to use the density response relationship reported in the literature for uniform cross section cantilever sensors. That is:

$$\frac{f_{fluid}}{f_{vac}} = \left(1 + \psi \cdot \frac{\pi \rho w}{4\rho_c t}\right)^{-1/2} \quad (7)$$

where $f_{fluid}$ and $f_{vac}$ are resonant frequency in fluid of density (ρ) and resonant frequency in vacuum. The geometric factor ψ was originally introduced that corrects for the aspect ratio of the cantilever. The PBS density can be expressed as ρ(X)=ρ$_w$(1+αX) where X is the mass fraction of solute phosphate, ρ$_w$ is the density of water at 20° C. (0.998 g/mL) and α is a dimensionless coefficient that fits experimentally determined solution density. Thus, Equation (8) can be arranged to:

$$\left(\frac{f_w}{f_x}\right)^2 = 1 + \alpha\frac{\psi\beta}{1+\psi\beta}X \quad (8)$$

where β=πρ$_w$/4ρ$_c$t contains only physical properties and geometric parameters and ψ=0.613√L/ρ$_c$√t for the first mode and for higher modes the value is determined experimentally. Although ψ depends on the geometry and mode number, it is a constant for a given cantilever. Therefore, it was expected that a plot of (f$_w$/f$_x$)² a against solute mass fraction X would be a straight line as given in FIG. 5C. As can be seen in that figure the experimental correlation is linear with correlation coefficient for both modes being better than 0.999. The slope obtained for the first mode with experimental data is 0.315 and compares favorably with 0.312 and 0.351 determined from Equation (7) and ψ from previous calculations, respectively. For the second mode it was noted that the experimental results follow the predicted straight line relationship, but a quantitative comparison of slope is not possible without the empirical constant that is specific to the geometry tested for the second mode.

Sensitivity Measured Using A Binding Reaction

Density shifts provided an estimate of sensing sensitivity of the two modes. A density change causes a uniform loading of mass all along the entire cantilever. In a sensing application, the target analyte binds to receptor immobilized on the sensor. The receptor is often immobilized at the distal tip of the cantilever. Therefore, a truer measure of sensitivity is the response associated with binding reaction to the sensor surface. In order to examine this property of the fabricated PZT cantilevers, resonant frequency response to chemisorption reaction of dodecanethiol was measured. The sulfur in thiol binds to gold <111> sites with high affinity that is equivalent to a covalent bond.

A thin layer of gold (100 nm) was sputtered down at the distal end of ≈1 mm², that provided Au <111> sites. This experiment was carried out in ethanol at a flow rate of 0.6 mL/min. Once the resonant frequency reached a steady state, the flow was changed from ethanol to 60 pM dodecanethiol in ethanol. As soon as dodecanethiol came in contact with the sensor the resonant frequency began to decrease monotonically and reached a new steady state resonant frequency in about 10 minutes. The resulting frequency shifts obtained were 26 Hz and 123 Hz for the first and second modes, respectively. The response reached steady state in 14 minutes during which the sensor was exposed to 101.8 pg of dodecanethiol. If assumed that all entering dodecane thiol chemisorbed to Au<111> sites on the sensor (an unlikely event) one would estimate sensitivity as 3.9 pg/Hz for the first mode and 828 fg/Hz for the second mode. As expected, the mass-change sensitivity for sensing application of the PZT cantilever is higher than the value calculated from density change experiments, because in the latter mass loading was on the entire sensor.

Figure 6:
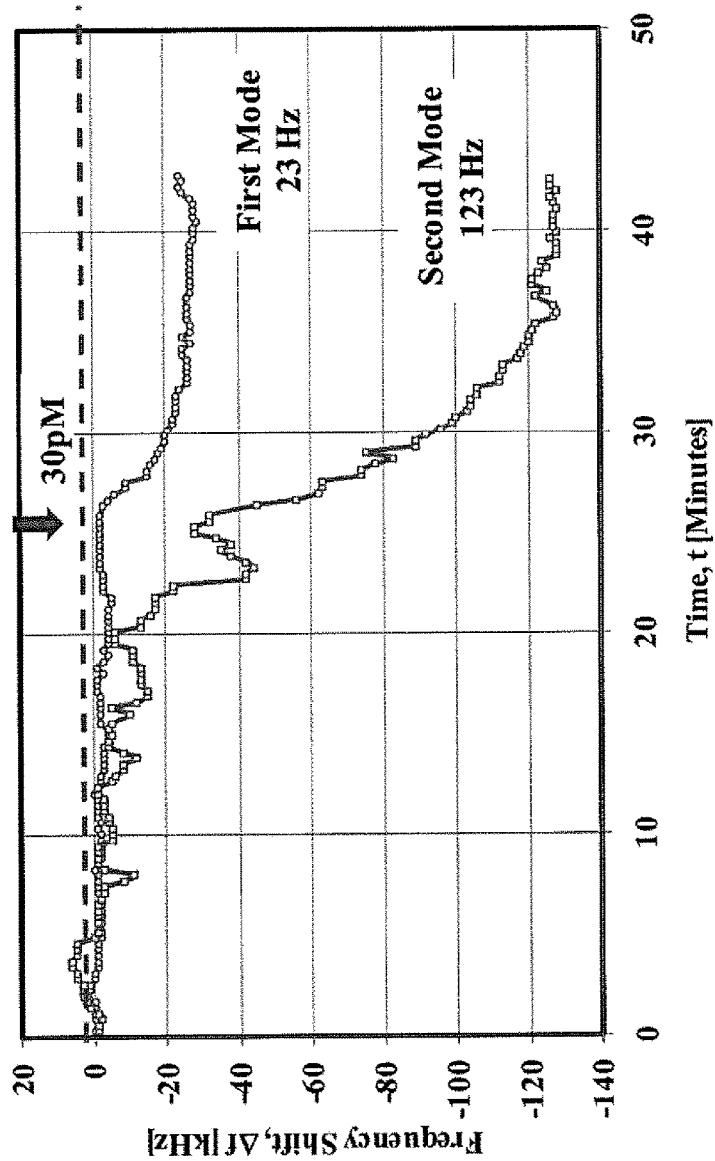
FIG. 6 illustrates the frequency response of the first and second bending modes in response to 30 pM dodecanethiol.

FIG. 6 illustrates the frequency response of the first and second bending modes in response to 30 pM dodecanethiol. Once the thiol comes in contact with the sensor, the frequency starts decreasing and reaches a steady state on the surface has saturated with the thiols. The frequency shifts obtained for the first and the second mode were 23 Hz and 123 Hz for the same chemisorbed mass.

In a study with PZT composite cantilever sensors in which PZT was bonded to a stainless steel film to induce bending mode, a 1 nM hexadecane thiol induced a 116 Hz response when measured in batch mode. The sensor was wider (2 mm) and length of stainless steel was 3 mm and the third mode resonant frequency 45.5 kHz was used for sensing. If was assumed that all thiols in the 1 mL sample chemisorbed, sensitivity calculated is ~2.2 pg/Hz and is poorer than the sensitivity value obtained for second mode in the present study. It is believed that the second mode PZT cantilever is more sensitive (lower σ) than the third mode of composite PZT/stainless steel sensor because of the absence of parasitic mass.

By asymmetrically anchoring PZT, one can measure the first two resonant bending modes electrically without any external instrumentation. This approach is a significant improvement over the previous approach of bonding a non-piezoelectric material to induce measurable bending modes as it improves mass-change sensitivity due to avoidance of parasitic mass of non-piezoelectric layer. The first mode sensitivity is ~30 ng/Hz and ~217 pg/Hz for the second mode when mass loading occurs along the entire cantilever length. In chemisorpton experiments where binding occurred in the tip region, the same sensor showed an order of magnitude higher sensitivity of 3.9 pg/Hz and 828 fg/Hz for the two modes. The latter is more sensitive than similar sized composite cantilever sensors consisting of PZT-glass or PZT-stainless steel.

Asymmetric Electrodes

The uniform cross-sectioned lead zirconate titanate (PZT) macro-cantilever fabricated with an asymmetric electrode increased the Q-value of electrically measured resonant bending modes which exhibit picogram level sensitivity in liquid. Significant responses to density changes as small as 0.004 g/mL were obtained. The third mode was the most sensitive and exhibited a limit of sensitivity of one picogram in liquid as determined from 1-dodecanethiol chemisorption experiments. The sensitivity decreased with chemisorbed mass, and was log-linear over five orders of magnitude. The observed resonance responses are in agreement with literature cantilever bending models.

Piezoelectric-excited millimeter-sized cantilever (PEMC) sensors containing both a piezoelectric layer (PZT) and a non-piezoelectric layer (glass) enable excitation of mechanical resonant modes. Removal of the non-piezoelectric parasitic mass (glass), combined with an asymmetric electrode design makes excitation and measurement of mass-sensitive low-order resonant modes possible. When a symmetrically-electroded PZT cantilever is excited by an alternating electric field in the polarization axis, the cantilever deforms longitudinally in a harmonic fashion. On the other hand, if the electrode area on one side of the cantilever is less than on the other, the cantilever experiences differential longitudinal deformation, inducing bending modes.

Figure 7:
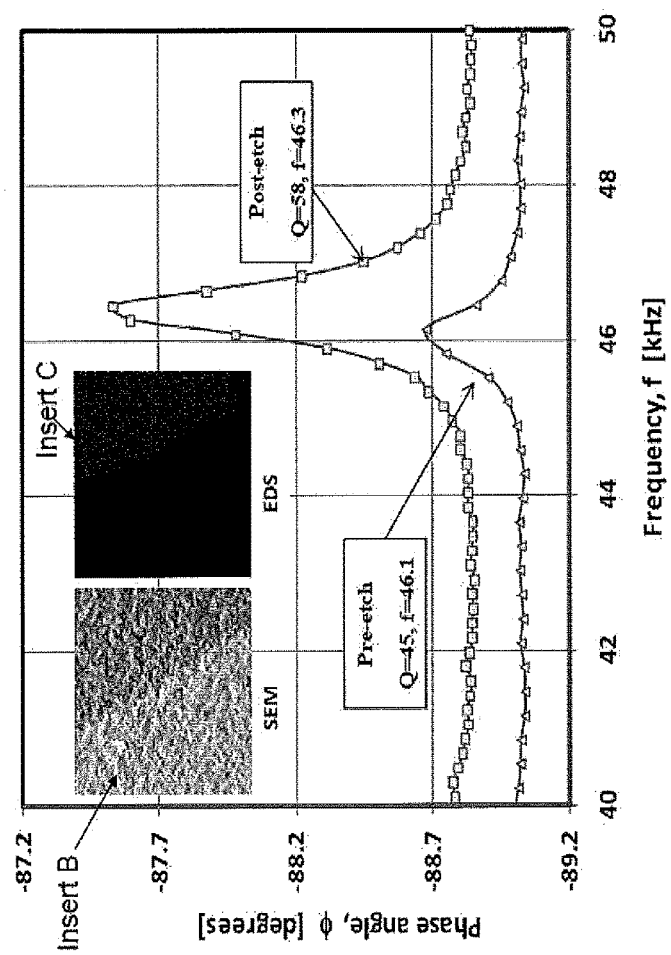
FIG. 7 illustrates that the resonance spectra of the second bending mode shows partial etching of Ni electrode on one side of PZT amplifies Q by 29% and gave a slightly higher resonant frequency.

FIG. 7 illustrates that the resonance spectra of the second bending mode shows partial etching of Ni electrode on one side of PZT amplifies Q by 29% and gave a slightly higher resonant frequency. Insert B shows a scanning electron microscope (SEM) image of PZT surface showing both the etched (light gray) and not etched (dark gray) portions of the electrode. Insert C is an energy density scan (EDS) showing high energy density of Ni (upper right corner of insert C) where no etching occurred and very low energy density of Ni over etched region.

The spectra of PZT cantilevers (3.4×1×0.127 $mm^3$) prepared with symmetric and asymmetric electrodes were compared for verification of this approach in FIG. 7. In FIG. 7, the manifestation of the second bending mode increases (−88.7°; Q=45 to −87.5°; Q=58) because of electrode asymmetry enhancing signal-to-noise ratio by a factor of 5. In the example shown, one mm of the nickel (Ni) electrode on the distal side of PZT was etched (10 minutes, 0.1 M $FeCl_3$) to obtain asymmetric electrode. Removal of Ni was confirmed by scanning electron microscopy and energy density scans (Insert B and C). Although the symmetrically-electroded sensor minimally expressed the resonant mode, the asymmetrically-electroded sensors always yielded a higher electrical expression of mechanical resonance and Q increased by 33±13% (n=9 sensors).

Figures 8A, 8B:
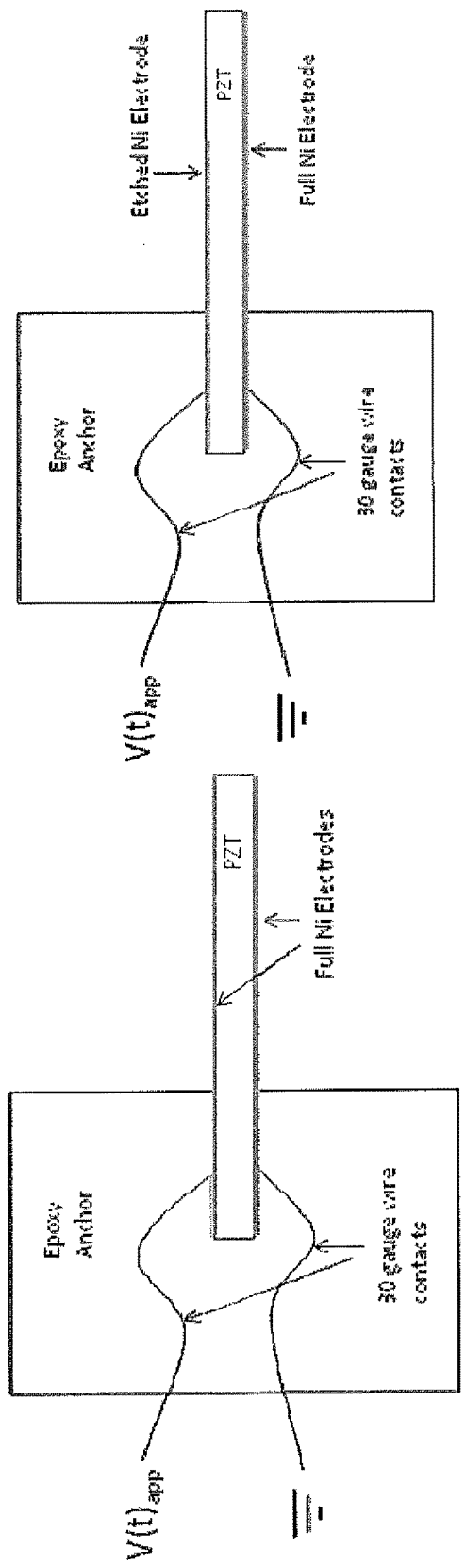
FIG. 8A illustrates a schematic diagram of a PEMC sensor before electrode etch.
FIG. 8B illustrates a schematic diagram of a PEMC sensor after 1 mm of Ni electrode was etched using 0.1 M $FeCl_3$ solution.

FIG. 8 includes FIG. 8A and FIG. 8B. FIG. 8A illustrates a schematic diagram of a PEMC sensor before electrode etch. FIG. 8B illustrates a schematic diagram of a PEMC sensor after 1 mm of Ni electrode was etched using 0.1 M $FeCl_3$ solution. Excitation at 0.1 sin(ωt) volts applied across the Ni electrodes. Wire contacts provide ability to both excite and measure resonance. Diagram is not drawn to scale. Typical cantilever dimensions range 2.0-3.5 mm length, 1 mm width, and 127 μm thick.

The $n^{th}$ mode resonant frequency of a uniform cross-section cantilever subjected to small deformations ("plane stress" model) is $f_n=(1/2\pi)(k/m_{eff,n})^{1/2}$, where $m_{eff,n}=3\ m/\lambda_n^4$ is effective mass, m=cantilever mass, $k=3EI_z/L^3$ is effective spring constant, E=Young's modulus ($E_1$=66 GPa), I=moment of inertia (=1.71 $10^{-4}\ mm^4$), L=cantilever length (=3.4 mm), and $\lambda_n$ is $n^{th}$ eigenvalue of 1+cos h(λ)cos(λ)=0. Analytically, the first three bending modes are at 5.2, 32.4, and 90.6 kHz. Experimentally, the modes were measured at comparable values of 5.5±0.4, 30.8±1.4, and 89.1±3.7 kHz (n=3 devices). The corresponding Q-values in air were 47±8, 48±7, and 37±3, and 33±5, 43±6, and 29±2 in deionized water (DIW), respectively. The minimal change in Q is due to high Re (~$10^5$) indicating negligible viscous effects.

For in-liquid applications, the sensor was parylene-c (5 μm) coated for insulating PZT. The effective mass of a cantilever in a fluid increases because the fluid adjacent to the cantilever also moves with the oscillating surface. The resonant frequency (f) in a fluid is given by $f_2=(1+\pi\rho_2 w/4\rho_c t)^{-1/2} f_{vac}$, where $f_{vac}$ and $f_2$ are in vacuum and in a medium of density $\rho_2$, t=cantilever thickness and $\rho_c$=cantilever density. For a submerged cantilever in DIW (ρ=0.998 g/mL) the model predicts the first three bending modes at 3.9, 24.4, and 68.1 kHz, respectively. Experimentally, the modes in DIW were at 4.3±0.5, 26.2±2.1, and 73.0±3.5 kHz (n=3 devices) indicating agreement within 9%.

Figure 9:
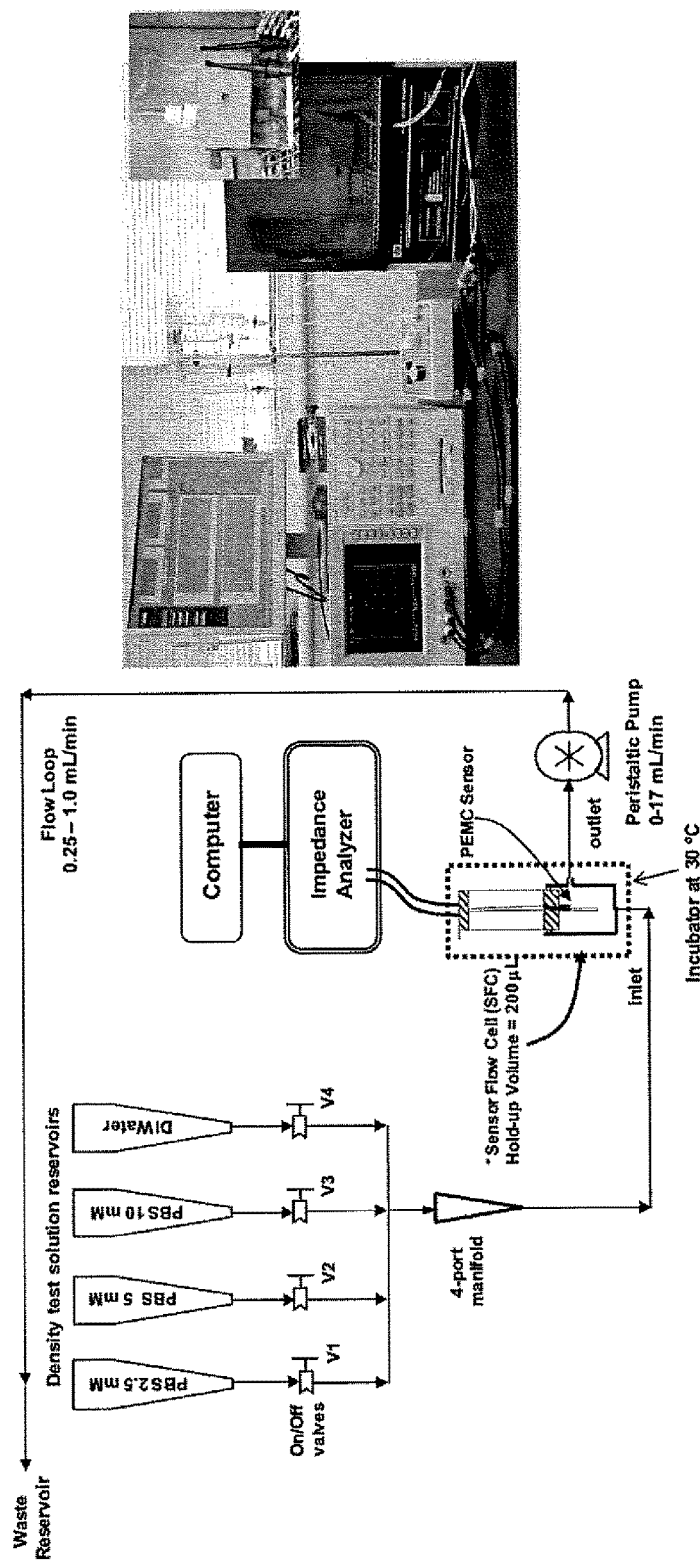
FIG. 9 depicts an example schematic diagram and picture of experimental apparatus.

For measuring small density changes, the sensor was installed in a flow cell and a flow rate of 0.6±0.1 mL/min was used. In situ experiment in a flow format avoids measurement ambiguities and results in reliable and repeatable responses. Details of an example experimental apparatus are shown in FIG. 9. FIG. 9 depicts an example schematic diagram and picture of experimental apparatus; 4192A LF 5 Hz-13 MHz Hewlett-Packard impedance analyzer interfaced with a computer excites and measures resonant frequency of a PEMC sensor installed in a custom flow cell. Data acquisition was carried out by a custom LABVIEW program. Isothermal condition is maintained by the incubator at 30° C.

The resonant frequency of the first three modes was monitored continuously as the running fluid was changed between DIW and phosphate buffered saline (PBS) solutions (2.5 to 10 mM). Upon changing from DIW to higher density PBS, the resonant frequency decreased for all three modes. The shifts were successively higher with mode number and with higher density differences.

Figure 10A:
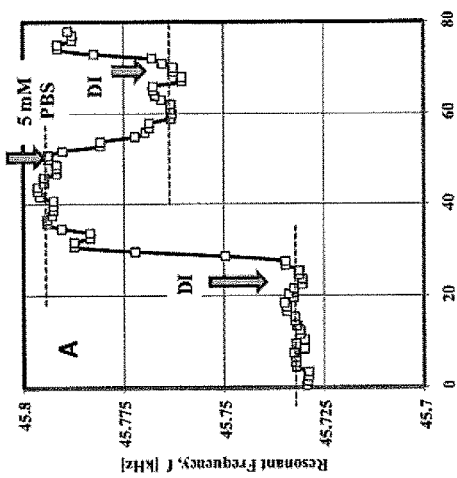
FIG. 10A depicts an example real-time sensor response over the course of a liquid density change experiment.
Figure 10B:
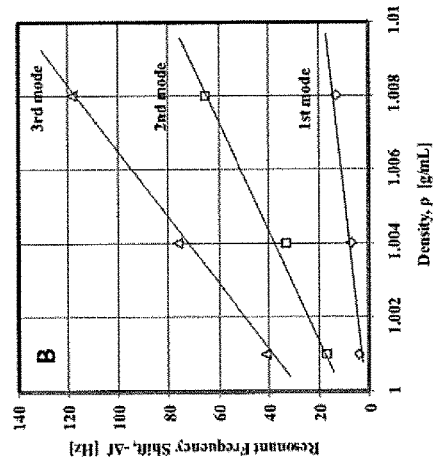
FIG. 10B depicts an example decrease in resonant frequency values for changing from DIW to liquids of higher density is found to be linear with respect to the density of the higher density liquid.

Typical density change response and a compilation of measured frequency changes as a function of liquid density are summarized in FIG. 10. FIG. 10 includes FIG. 10A and FIG. 10B. FIG. 10 A depicts an example real-time sensor response over the course of a liquid density change experiment. The sensor was initially stabilized in 10 mM PBS creating a baseline for the experiment. After a baseline was reached, the flowing liquid was changed form 10 mM PBS to DIW ($\Delta\rho=0.010$ g/mL) and allowed to reach new resonant frequency value. The change caused the frequency to increase by 65 Hz. After reaching steady state in DIW, the flowing liquid was then switched to a less concentrated PBS solution (5 mM, $\Delta\rho=0.006$ g/mL) resulting in a resonant frequency decrease of 33 Hz. FIG. 10 B depicts an example decrease in resonant frequency values for changing from DIW to liquids of higher density is found to be linear with respect to the density of the higher density liquid. The overall change in density investigated is 0.8% which is small enough that a linear response is seen. The model described in the text of the manuscript predicts a square root relationship. Note that the third bending mode is most sensitive.

The model predicts the first bending mode to decrease by 3, 5, and 9 Hz for changes between DIW and 2.5 mM ($\rho=1.001$ g/mL), 5 mM ($\rho=1.004$ g/mL), and 10 mM ($\rho=1.008$ g/mL) PBS, respectively. Experimentally, successive changes between DIW and 2.5 mM, 5.0 mM, and 10 mM PBS caused the first mode to decrease by 4±1, 7±2, and 13±2 Hz (n=3 sensors), respectively. For the second mode, the model predicts a decrease of 16, 32, and 54 Hz for the same changes, and experimental results were in agreement being 17±5, 32±8, and 65±9 Hz (n=3 sensors), respectively. The third mode, in comparison, gave the largest response. The model predicted values were in good agreement with experiments, 45 vs. 41±6, 89 vs. 76±10, and 149 vs. 120±11 Hz, respectively; n=3 sensors.

Although density-change experiments give a measure of sensitivity, detection sensitivity is best tested by binding experiments in liquid. Therefore, molecular chemisorption of 1-dodecanethiol (DDT, 202 Da) was conducted in flow. Gold (Au) sputtered on the sensor (0.75 mm² per side, 100 nm) gave Au <111> sites. X-ray diffraction confirmed >95% Au<111>. The <111> sites chemisorb sulfur in the sulfhydral functional group (—SH) of DDT with binding energy comparable to covalent bonding. The sensor (L=2.2 mm) was first allowed to reach steady-state in ethanol (0.6±0.1 mL/min; 30.0±0.1° C.) in the custom flow cell apparatus (200 μL contact volume; 1.0 mL flow loop volume; FIG. 9). Flow was changed to various DDT solutions (1 pM-10 nM), and the resonant frequency at 72.6 kHz was monitored continuously as depicted in FIG. 11 and FIG. 12.

Figures 11A, 11B:
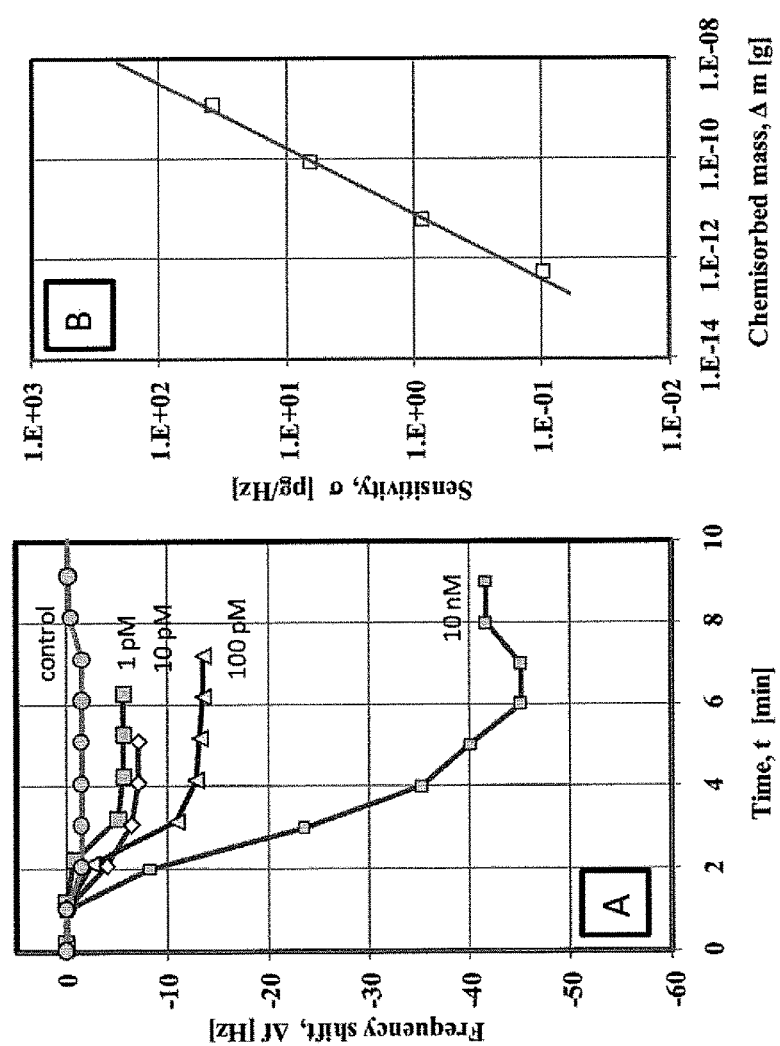
FIG. 11A depicts an example time-shifted sensor responses for 1-dodecanethiol chemisorption at 1 pM-10 nM. Shown data are from separate experiments with the same sensor.
FIG. 11B depicts an example sensor mass-change sensitivity ($\sigma$) as a function of chemisorbed mass of DDT shows a sensitivity limit about one picogram in liquid.

FIG. 11 includes FIG. 11A and FIG. 11B. FIG. 11A depicts an example time-shifted sensor responses for 1-dodecanethiol chemisorption at 1 pM-10 nM. Shown data are from separate experiments with the same sensor. FIG. 11B depicts an example sensor mass-change sensitivity ($\sigma$) as a function of chemisorbed mass of DDT shows a sensitivity limit about one picogram in liquid.

Figure 12:
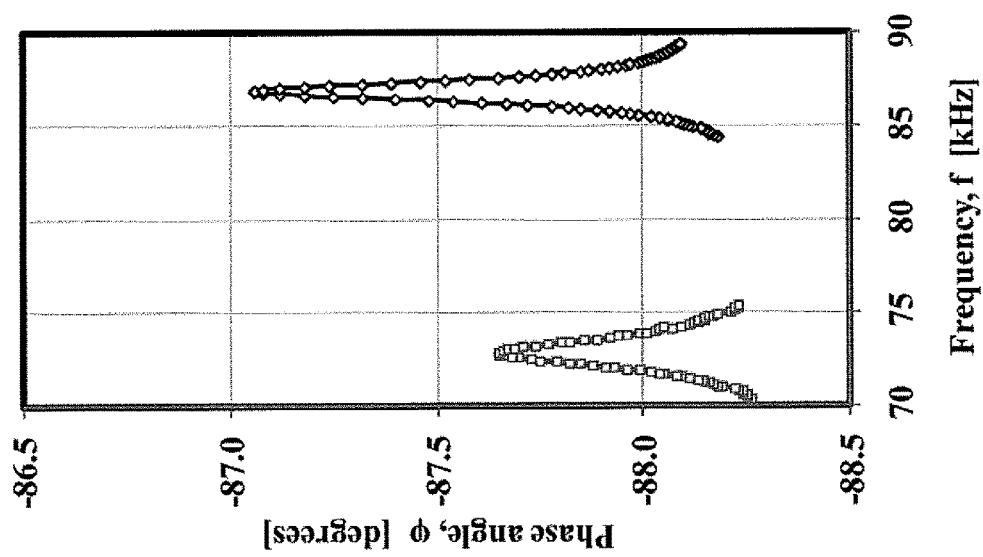
FIG. 12 illustrates the resonant mode used for measuring dodecanethiol (DDT) chemisorption in air (f=86.9 kHz, Q=61) and in ethanol (f=72.6 kHz, Q=40). The 33% decrease in Q-value and resonant frequency decrease of 14.3 kHz was due to immersion in ethanol.

FIG. 12 illustrates the resonant mode used for measuring dodecanethiol (DDT) chemisorption in air (f=86.9 kHz, Q=61) and in ethanol (f=72.6 kHz, Q=40). The 33% decrease in Q-value and resonant frequency decrease of 14.3 kHz was due to immersion in ethanol.

The resonant frequency decreased as binding occurred. Exposure of a virgin sensor separately to 1 pM, 10 pM, 100 pM, and 10 nM DDT caused decreases of 5±1, 7±1, 14±2 and 42±2 Hz, respectively (FIG. 8A). Standard deviation noted is signal noise at steady-state. After steady state was reached, switch to ethanol did not result in resonant frequency increase verifying that the response was due to chemisorbed DDT. The binding kinetics yielded rate constants from 0.08 min⁻¹ to 0.20 min⁻¹ over the concentrations tested, and are comparable with previous work using similar sized alkanethiols. Since each Au <111> site chemisorbs one DDT molecule and each DDT molecule occupies ~24 Å² area, it was expected that ~10¹³ DDT molecules (=one nanogram (ng)) can potentially bind to the sensor, assuming full coverage and low defects. Analytically, the resonant frequency decrease for small mass additions to the sensor can be determined from $df_n/dm=-2f_n/m_{\mathit{eff},n}$. For a one ng mass, the model predicts a decrease of 43 Hz, which compares favorably to the experimental results of 42±2 Hz.

The responses in FIG. 11A can be used to determine mass-change sensitivity as a function of chemisorbed mass. The mass-change sensitivity ($\sigma$) was defined as the mass that causes a unit resonant frequency decrease. For example, the binding profile for 100 pM DDT showed a transient of ~7 minutes, a time during which the sensor was exposed to ~90 pg of DDT. Since the resonant frequency decreased by 14 Hz, the mass-change sensitivity, assuming all entering DDT chemisorbed, is 6 pg/Hz. Similarly, 1 pM DDT response gave $\sigma$~100 fg/Hz. Note that $\sigma$ numerically increases with chemisorbed mass, and exhibits a log-linear relationship over five orders of magnitude tested (FIG. 11B). For further verification of sensitivity, mass-addition experiments were conducted in air. To a sensor at 23° C., 0.2 μL of wax-in-hexane (25 pg/μL) was added to sensor tip. After hexane evaporated and resonant frequency reached a new steady-state resulting in a decrease of 51±19 Hz (n=3 repeat experiment). Such a response indicates a sensitivity of 98±27 fg/Hz in air, and is comparable to in-liquid values because of negligible viscous effects; Re~10⁵.

Modifying the electrode of a piezoelectric (PZT) cantilever enables expression of mass-change sensitive resonant modes that normally do not lend themselves to electrical measurement. Chemisorption experiments indicate that sensitivity varies with added mass. At the lowest added mass (500 fg) the sensitivity is ~100 fg/Hz, and at the highest added mass (1 ng) the sensitivity is ~24 pg/Hz. A response of 10 Hz at a good signal-to-noise ratio would enable detection of one picogram. If a higher bending mode can be expressed electrically, the model predicts the limit of detection can be further enhanced.

Although illustrated and described herein with reference to certain specific embodiments, an asymmetric sensor as described herein is not intended to be limited to the details shown. Rather, various modifications may be made in the details within the scope and range of equivalents of the claims and without departing from the spirit of the invention.

What is claimed:

1. A piezoelectric cantilever sensor having a receptor immobilized thereon to which an analyte binds, said sensor being asymmetrically anchored at one end such that anchoring on one side of the sensor is longer than anchoring on another side of the sensor whereby the cantilever sensor exhibits different resonant bending modes that can be measured electrically without external instrumentation that measures sensor oscillation.

2. The piezoelectric cantilever sensor of claim 1, wherein the piezoelectric cantilever sensor comprises lead zirconate titanate.

3. The piezoelectric cantilever sensor of claim 1, wherein the anchoring on one side of the sensor being longer than the anchoring on the another side of the sensor is adapted to cause differential longitudinal deformation of said cantilever sensor so as to induce transverse vibration that causes charge accumulation in said piezoelectric cantilever sensor whereby the different resonant bending modes become electrically measurable.

4. The analyte sensor of claim 1, wherein the receptor is immobilized at a distal tip of the piezoelectric cantilever sensor at a longitudinal end of said cantilever opposite said one end.

5. A piezoelectric cantilever sensor having a receptor immobilized thereon to which an analyte binds, said sensor being anchored at one end and having asymmetric electrode portions on respective sides of the cantilever sensor such that a first electrode portion on one side of the cantilever sensor has a first area that is larger than a second area of a second electrode portion on another side of the cantilever sensor whereby the cantilever sensor exhibits different resonant bending modes that can be measured electrically without external instrumentation that measures sensor oscillation.

6. The piezoelectric cantilever sensor of claim 5, wherein the cantilever sensor comprises lead zirconate titanate.

7. The piezoelectric cantilever sensor of claim 5, wherein the first and second areas of the first and second electrode portions are adapted to cause differential longitudinal deformation of said cantilever sensor so as to induce transverse vibration that causes charge accumulation in said piezoelectric cantilever sensor whereby the different resonant bending modes become electrically measurable.

8. The analyte sensor of claim 5, wherein the receptor is immobilized at a distal tip of the piezoelectric cantilever sensor at a longitudinal end of said cantilever opposite said one end.

* * * * *